(12) United States Patent
Zhang

(10) Patent No.: US 7,301,403 B2
(45) Date of Patent: Nov. 27, 2007

(54) LOW NOISE AMPLIFIER WITH SWITCH GAIN CONTROL

(75) Inventor: Zhaofeng Zhang, Shanghai (CN)

(73) Assignee: Comlent Technology, Inc., Shanghai (CN)

( * ) Notice: Subject to any disclaimer, the term of this patent is extended or adjusted under 35 U.S.C. 154(b) by 152 days.

(21) Appl. No.: 11/223,344

(22) Filed: Sep. 10, 2005

(65) Prior Publication Data

US 2007/0057733 A1    Mar. 15, 2007

(51) Int. Cl.
*H03F 3/04* (2006.01)
(52) U.S. Cl. .................................. 330/311; 330/253
(58) Field of Classification Search ............... 330/253, 330/254, 257, 261, 311
See application file for complete search history.

(56) References Cited

U.S. PATENT DOCUMENTS

| | | | |
|---|---|---|---|
| 6,002,860 A * | 12/1999 | Voinigescu et al. | 703/14 |
| 6,026,286 A * | 2/2000 | Long | 455/327 |
| 7,027,792 B1 * | 4/2006 | Luff et al. | 455/314 |

* cited by examiner

*Primary Examiner*—Henry Choe
(74) *Attorney, Agent, or Firm*—Clement Cheng

(57) ABSTRACT

This invention presents a low noise amplifier with switching gain control, comprising an amplifier having an impedance matching circuit a switch circuit, a signal amplifying branch circuit, a switch control circuit, a signal attenuating circuit and a current bias circuit, wherein the switch circuit controls signal amplifying or attenuating based on the high or low of an input signal level. This invention provides low noise, great dynamic range, increased system integration, and low power consumption. This invention is used for integrated circuit wireless communication system and RF preamplifiers for receiver.

20 Claims, 3 Drawing Sheets

LOW NOISE AMPLIFIER WITH SWITCH GAIN CONTROL

FIELD OF THE INVENTION

The present invention relates to a low noise amplifier with switch gain control, and more particularly to a low noise amplifier in the receiving device of a wireless radio frequency system.

BACKGROUND OF THE INVENTION

It is well known that the low noise amplifier is one of the essential components among wireless RF system devices. Commonly a low noise amplifier is used at the rear end of a wireless receiving device (e.g. antenna), to amplify very weak signal(s) received by the receiving device. The low noise amplifier requires a circuitry with low noise and high amplified ratio. Also when the input signal is strong it requires a more precise linearity and low gain.

FIG. 1 shows a block diagram of a prior art low noise amplifier having a switch parallel connected to the amplifier. The switch forms a bias circuit. The switch turns on when the input signal is low, forming an amplified gain. The switch turns off when the input signal is high, ensuring system linearity. However since a 50 Ω impedance is required in the system, energy consumption is high, and moreover the whole system cannot be integrated. Even when CMOS technique is used, a larger potential capacitor will be required, but with low isolation, which will induce a mismatched input signal when the switch turns off.

SUMMARY OF THE INVENTION

The purpose of the present invention is to introduce a low noise amplifier with switch gain control, to raise the dynamic range of the wireless receiving device, increase the system integrated level, ensure the receiving sensitivities, and prevent saturation and clog occurring at rear end circuit of low noise amplifier.

The above purpose of present invention can be implemented as follows: A low noise amplifier with switch gain control consists of an amplifier having an impedance matching circuit connecting a switch circuit; the switch circuit delivers high or low signals into either signal amplifying path and signal attenuating path. The amplifier also connects to a current bias circuit.

The whole system dynamic range is improved when the present invention being utilized on receiver chip in wireless communication system, or on the front end chip in radio frequency (RF) receiver. The present invention can be implemented through either CMOS technique or BiCMOS technique. The signal path selection in present invention creates different gain. When the gain changes, the impedance on either input or output amplifier terminals remains the same. Specifically when input signal is low, the switch turns on, allowing the signal runs through signal amplifying circuit, while when the input signal is high, the switch turns off, allowing the signal runs through signal attenuating circuit. Such design is able to improve system gain, improve system linearity, lower noise, and ensure receipt sensitivity, while being fully integrated.

Legend: $L_g$ is an inductor; $M_1$ is a voltage convertor (the NMOS transistor); $L_s$ is an inductor; $M_2$ is a transistor; $L_d$ is an inductor; $M_3$ is a transistor; $R_d$ is a resistor.

DETAILED DESCRIPTION OF THE PREFERRED EMBODIMENT

Figure 6:
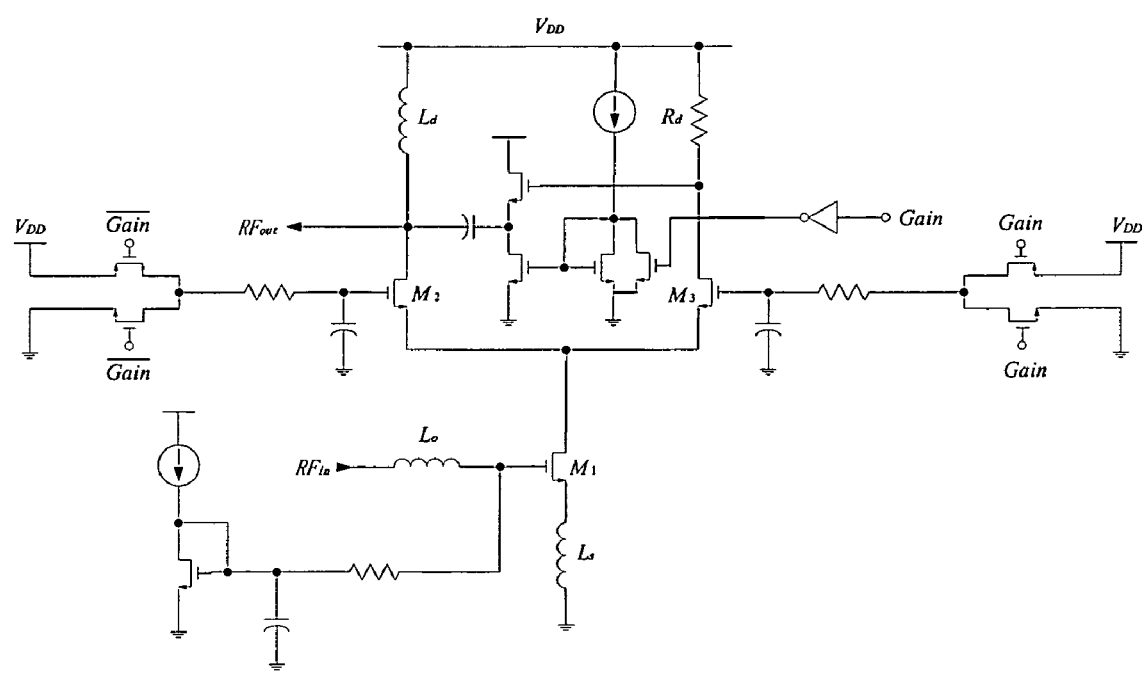
FIG. 6 is a detail circuit diagram of a Low Noise Amplifier with switch gain control in present invention.

Detail description of the drawings of the best embodiment is described as follows:

FIG. 6 shows an integrated Low Noise Amplifier with switch gain control. The Low Noise amplifier consists of an impedance matching circuit connecting a switch circuit, while the switch circuit delivers high or low signals into signal amplifying circuit and signal attenuating circuit. The amplifier also couples a current bias circuit.

Figure 1:
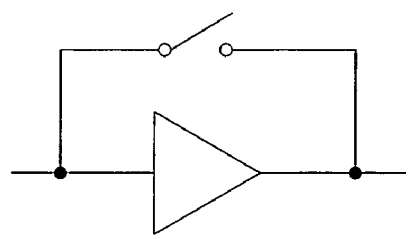
FIG. 1 is a circuit diagram of a prior art Low Noise Amplifier.
Figure 2:
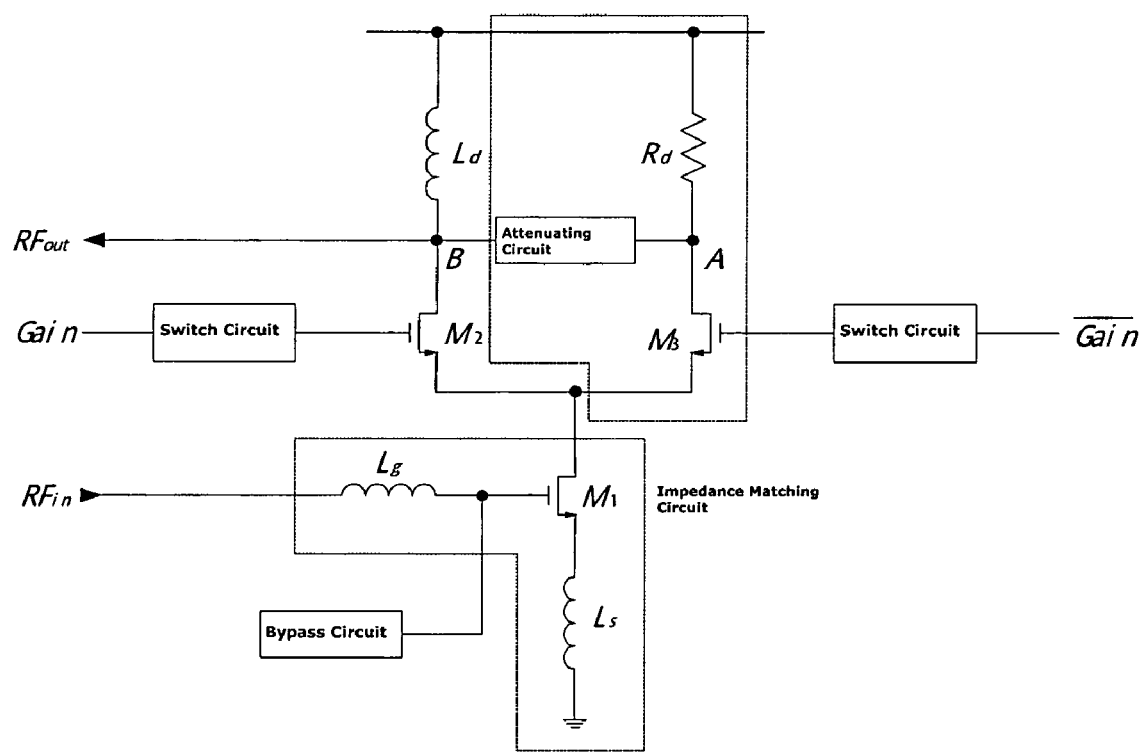
FIG. 2 is a schematic diagram of a Low Noise Amplifier with switch gain control in present invention.

As shown in FIG. 2, the impedance matching circuit consists of an inductor $L_g$, a voltage-current converter $M_1$ and an inductor $L_s$. The impedance circuit in the present invention is also named narrow-band input matching. Under a fixed RF input signal, narrow-band input matching can achieve inhibition effect by a 50 Ω matching through resistance neutralization. The voltage-current converter $M_1$ is made of NMOS transistor, which is also the most influential component to all aspects, including noise level, in circuit design. Improving the bias current or the size of the transistor $M_1$ may reduce noise level, and its linearity has direct relationship with circuit matching, amplified gain and circuit noise.

Also in FIG. 2, the signal amplifying circuit consists of transistor $M_1$, transistor $M_2$, inductor $L_d$ and a potential capacitor incorporated at the drain gate of transistor $M_2$. When the switch turns transistor $M_1$ on, the signal amplifying circuit functions. Then transistor $M_1$ transfers an input RF signal into a current signal. Transistor $M_2$ has an isolating effect, largely reducing the Miller effect existing on the potential capacitor incorporated at the drain gate of transistor $M_2$. The impedance at output terminal therefore does not have effect on the impedance at input terminal. In addition, transistor $M_2$ raises input impedance, improving system gain. Both resonance frequency of the insulator and the potential capacitor are on center operating frequency.

Figure 3:
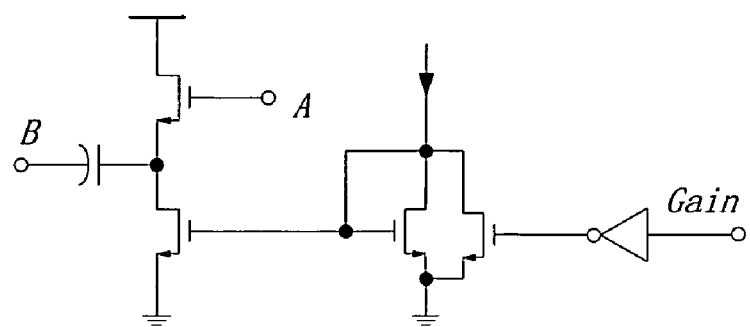
FIG. 3 is a circuit diagram of an attenuating circuit of a Low Noise Amplifier with switch gain control in present invention.

As shown in FIG. 3, the attenuating circuit consists of a transistor $M_3$, a resistance $R_d$ and a voltage follower. The attenuating circuit functions when transistor $M_3$ turns on and transistor $M_2$ turns off, inducing the current from transistor $M_1$ to travel to transistor $M_3$. Low resistance $R_d$ is used to reduce amplifying ratio. The voltage follower output connects to the output terminal of the low noise amplifier through a capacitor, enabling more attenuation.

Figure 4:
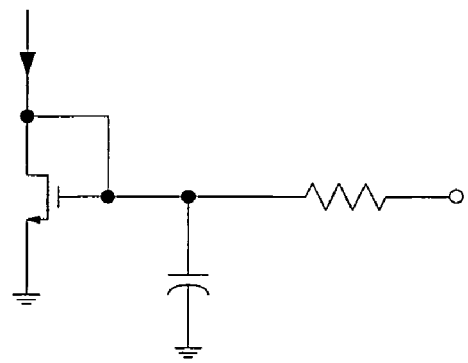
FIG. 4 is a circuit diagram of a current bias circuit of a Low Noise Amplifier with switch gain control in present invention.

As shown on FIG. 4, the current bias circuit provides a bias current to the amplifier. The capacitor is used to filter noise in bias current, and the resistance is used to isolate bias circuit from the effect caused by RF signals.

Figure 5:
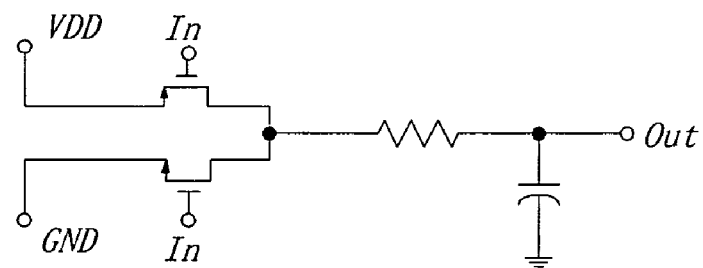
FIG. 5 is a circuit diagram of a switch circuit of a Low Noise Amplifier with switch gain control in present invention.

As shown on FIG. 5, the switch circuit, controlled by transistors $M_2$ and $M_3$, connects the output terminal to either voltage source or ground, where the resistance has isolating effect, and the capacitor assures a virtual ground output.

The invention claimed is:

1. A low noise amplifier with switch gain control comprising: an amplifier having an impedance matching circuit connecting a switch circuit, the switch circuit delivering high or low signals into a signal amplifying circuit and a signal attenuating circuit, wherein said amplifier also connects to a current bias circuit, wherein the attenuating circuit comprises a transistor, a resistor and a voltage follower.

2. The low noise amplifier of claim 1 wherein the voltage-current converter comprises a NMOS transistor.

3. The low noise amplifier of claim 1 wherein the signal amplifying circuit comprises transistors, an inductor and a potential capacitor incorporated at a drain gate of a transistor.

4. A low noise amplifier with switch gain control comprising: an amplifier having an impedance matching circuit connecting a switch circuit, the switch circuit delivering high or low signals into a signal amplifying circuit and a signal attenuating circuit, wherein said amplifier also connects to a current bias circuit, wherein the current bias circuit provides a bias current to the amplifier wherein the attenuating circuit comprises a transistor, a resistor and a voltage follower.

5. The low noise amplifier of claim 4 wherein the switch circuit, controlled by a plurality of transistors, connects an output terminal to either a voltage source or a ground terminal.

6. The low noise amplifier of claim 5, wherein the signal amplifying circuit comprises transistors, an inductor and a potential capacitor incorporated at a drain gate of a transistor.

7. A low noise amplifier with switch gain control comprising: an amplifier having an impedance matching circuit connecting a switch circuit, the switch circuit delivering high or low signals into a signal amplifying circuit and a signal attenuating circuit, wherein said amplifier also connects to a current bias circuit wherein the switch circuit, controlled by a plurality of transistors, connects an output terminal to either a voltage source or a ground terminal, wherein the attenuating circuit comprises a transistor, a resistor and a voltage follower.

8. The low noise amplifier of claim 7 wherein the current bias circuit provides a bias current to the amplifier.

9. The low noise amplifier of claim 7 wherein the switch circuit, controlled by a plurality of transistors, connects an output terminal to either a voltage source or a ground terminal.

10. A low noise amplifier with switch gain control comprising: a voltage-current converter having an impedance matching circuit connecting to two common-gate Nmos, high gain path having inductor as loading, low gain path having a resistor as loading and an attenuator for further loss, a switch gain control circuit which control the signal go through high gain path or low gain path.

11. The low noise amplifier of claim 10, wherein the voltage-current converter connects to two common-gate Nmos.

12. The low noise amplifier of claim 10, wherein the high gain path is composed of a common-gate transistor, an inductor as loading, a switch gain control circuit.

13. The low noise amplifier of claim 12, wherein the common-gate transistor is controlled by the switch gain control circuit.

14. The low noise amplifier of claim 12, wherein the switch gain control is composed of two transistors as switches, a resistor and a capacitor composed low pass filter.

15. The low noise amplifier of claim 13, wherein the switch gain control, controlled by two switches, connects an output terminal to either a voltage source or a ground terminal.

16. The low noise amplifier of claim 10, wherein the low gain path is composed of a common-gate transistor, a resistor as loading, an attenuator circuit for further loss and a capacitor to the common output.

17. The low noise amplifier of claim 16, wherein the common-gate transistor is controlled by the switch gain control circuit.

18. The low noise amplifier of claim 16, wherein the resistor loading together with the parasitic capacitor is composed of a low pass filter.

19. The low noise amplifier of claim 16, wherein the attenuator circuit comprises a voltage follower, a bias circuit controlled by a switch circuit.

20. The low noise amplifier of claim 16, wherein the capacitor is between the voltage follower output and the ina output functions as an isolator between a high gain path and a low gain path.

* * * * *